(12) United States Patent
Hung et al.

(10) Patent No.: US 9,853,123 B2
(45) Date of Patent: Dec. 26, 2017

(54) SEMICONDUCTOR STRUCTURE AND FABRICATION METHOD THEREOF

(71) Applicant: UNITED MICROELECTRONICS CORP., Hsin-Chu (TW)

(72) Inventors: Kuo-Chin Hung, Changhua County (TW); Wei-Chuan Tsai, Changhua County (TW); Kuan-Chun Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 6 days.

(21) Appl. No.: 14/924,723

(22) Filed: Oct. 28, 2015

(65) Prior Publication Data

US 2017/0125548 A1    May 4, 2017

(51) Int. Cl.
*H01L 29/66* (2006.01)
*H01L 23/535* (2006.01)
*H01L 23/532* (2006.01)
*H01L 29/49* (2006.01)
*H01L 21/768* (2006.01)

(52) U.S. Cl.
CPC .. *H01L 29/66545* (2013.01); *H01L 21/76805* (2013.01); *H01L 21/76843* (2013.01); *H01L 21/76895* (2013.01); *H01L 23/535* (2013.01); *H01L 23/53266* (2013.01); *H01L 29/4966* (2013.01)

(58) Field of Classification Search
CPC ......... H01L 29/66545; H01L 21/76805; H01L 21/76843; H01L 21/76895; H01L 23/53266; H01L 23/535; H01L 29/4966
See application file for complete search history.

(56) References Cited

U.S. PATENT DOCUMENTS

| 7,338,900 | B2 |  | 3/2008 | Mizuno |  |
|---|---|---|---|---|---|
| 9,012,319 | B1 | * | 4/2015 | Choi | H01L 21/28158 |
|  |  |  |  |  | 438/591 |
| 9,059,176 | B2 | * | 6/2015 | Baumann | H01L 23/53238 |
| 2010/0144140 | A1 |  | 6/2010 | Chandrashekar |  |
| 2013/0270703 | A1 | * | 10/2013 | Zierath | H01L 23/53238 |
|  |  |  |  |  | 257/751 |
| 2015/0001720 | A1 | * | 1/2015 | Lin | H01L 23/53238 |
|  |  |  |  |  | 257/751 |
| 2015/0041926 | A1 | * | 2/2015 | Pradhan | H01L 29/66545 |
|  |  |  |  |  | 257/412 |
| 2016/0020142 | A1 | * | 1/2016 | Chen | H01L 21/76862 |
|  |  |  |  |  | 438/654 |

* cited by examiner

*Primary Examiner* — Neil Prasad
(74) *Attorney, Agent, or Firm* — Winston Hsu

(57) ABSTRACT

A semiconductor structure includes a substrate having thereon a dielectric layer. An opening is formed in the dielectric layer. The opening includes a bottom surface and a sidewall surface. A diffusion barrier layer is conformally disposed along the sidewall surface and the bottom surface of the opening. A nucleation metal layer is conformally disposed on the diffusion barrier layer. A bulk metal layer is disposed on the nucleation metal layer. A film-growth retarding layer is disposed between the nucleation metal layer and the bulk metal layer.

28 Claims, 5 Drawing Sheets

SEMICONDUCTOR STRUCTURE AND FABRICATION METHOD THEREOF

BACKGROUND OF THE INVENTION

1. Field of the Invention

The invention generally is related to a semiconductor structure and a method of making the same. More particularly, the invention is related to a high-k metal gate (HK/MG) semiconductor device that can avoid tungsten seam issues.

2. Description of the Prior Art

Continuing advances in semiconductor manufacturing processes have resulted in semiconductor devices with finer features and higher degrees of integration.

As the size of the integrated circuit devices continues to scale down, the polysilicon gate and the silicon dioxide insulating layer of a metal-oxide-semiconductor field effect transistor (MOSFET) structure have confronted with the physical limits of the materials themselves. To meet the demands of scalability, it is necessary to incorporate high-k metal gate (HK/MG) process.

Today, two main integration options remain: gate-first (often referred to as MIPS, metal inserted poly-silicon) and gate-last (also called RMG, replacement metal gate). The terminology "first" and "last" refers to whether the metal electrode is deposited before or after the high temperature activation anneal of the flow.

The RMG process typically involves a bulk tungsten filling process in a gate trench to form a low-resistance metal layer in the composite metal gate structure. After bulk tungsten filling, tungsten seams or voids are often observed in the bulk tungsten layer. Such tungsten seams are commonly exposed during subsequent chemical mechanical polishing (CMP) process, which results in electrical device degradation.

Therefore, there is a need in this technical field to provide an improved semiconductor structure such as a high-k metal gate semiconductor device without such tungsten seam issues.

SUMMARY OF THE INVENTION

It is one object of the invention to provide an improved semiconductor structure such as a high-k metal gate semiconductor device and fabrication method thereof, which is able to eliminating the tungsten seam or void.

According to one aspect of the invention, a semiconductor structure includes a substrate having thereon a dielectric layer. An opening is disposed in the dielectric layer. The opening includes a bottom surface and a sidewall surface. A diffusion barrier layer is conformally disposed along the sidewall surface and the bottom surface of the opening. A nucleation metal layer is conformally disposed on the diffusion barrier layer. A bulk metal layer is disposed on the nucleation metal layer. A film-growth retarding layer is disposed between the nucleation metal layer and the bulk metal layer. The diffusion barrier layer comprises titanium nitride.

According to one embodiment, the bulk metal layer comprises tungsten. The film-growth retarding layer comprises tungsten nitride. The film-growth retarding layer is disposed only on an upper surface of the nucleation metal layer within the opening.

According to one embodiment, the opening is a gate trench opening and the substrate is a semiconductor substrate. The dielectric layer is a silicon nitride spacer layer. The semiconductor structure further includes high-k dielectric layer and a work function metal layer between the substrate and the diffusion barrier layer.

According to another embodiment, the opening is a contact hole opening. The dielectric layer is an inter-layer dielectric (ILD) layer. A conductive region is disposed in the substrate and the diffusion barrier layer is in direct contact with the conductive region.

According to another aspect of the invention, a method for fabricating a semiconductor structure is disclosed. A substrate having thereon a dielectric layer is provided. An opening is formed in the dielectric layer. The opening comprises a bottom surface and a sidewall surface. A diffusion barrier layer is conformally deposited along the sidewall surface and the bottom surface of the opening. A nucleation metal layer is conformally deposited on the diffusion barrier layer. A film-growth retarding layer is then formed on an upper surface of the nucleation metal layer. A bulk metal layer is then deposited on the nucleation metal layer to fill up the opening.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The term substrate is understood to include semiconductor wafers. The term substrate is also used to refer to semiconductor structures during processing, and may include other layers that have been fabricated thereupon. The term "horizontal" as used herein is defined as a plane parallel to the conventional major plane or surface of the semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The following detailed description is, therefore, not to be taken in a limiting sense, and the scope of the present invention is defined only by the appended claims, along with the full scope of equivalents to which such claims are entitled.

Figure 1:
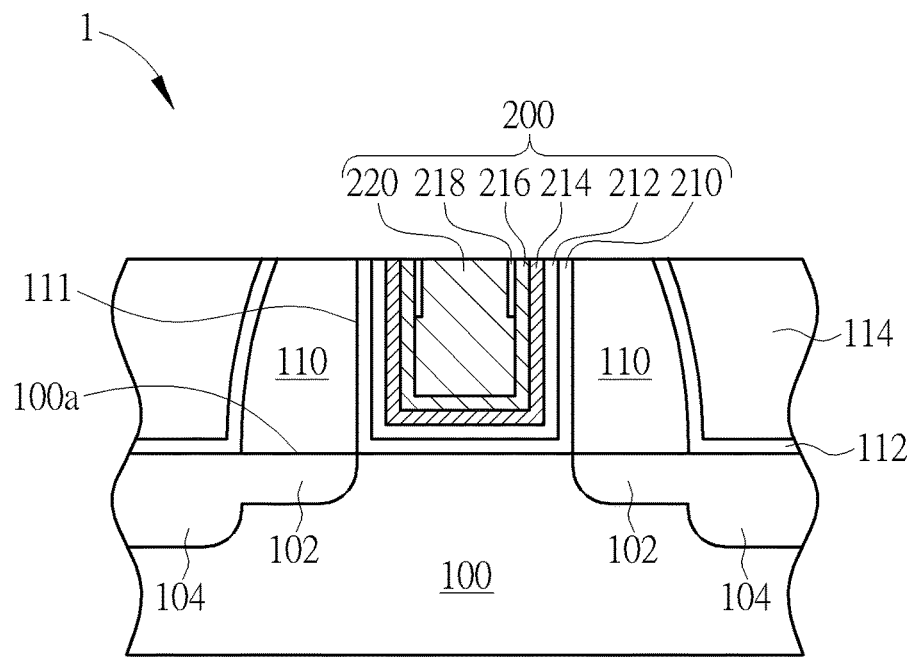
FIG. 1 is a schematic, cross-sectional diagram showing an exemplary semiconductor structure without tungsten seam in accordance with one embodiment of the invention.

Please refer to FIG. 1. FIG. 1 is a schematic, cross-sectional diagram showing an exemplary semiconductor structure 1 without tungsten seam in accordance with one embodiment of the invention. According to one embodiment, the semiconductor structure 1 may be a metal-oxide-semiconductor (MOS) transistor. For example, the semiconductor structure 1 may be a PMOS transistor or an NMOS transistor according to various embodiments of the invention.

As shown in FIG. 1, the semiconductor structure 1 includes a substrate 100. For example, the substrate 100 may be a silicon substrate or any other suitable semiconductor substrates such as SiGe substrate or a silicon-on-insulator (SOI) substrate, but not limited thereto. According to one embodiment, for example, the substrate 100 may be a P-type doped silicon substrate. The substrate 100 may comprise at least a fin structure, but not limited thereto.

The semiconductor structure 1 further includes a dielectric layer 110 on a main surface 100a of the substrate 100. According to one embodiment, the dielectric layer 110 may be a spacer layer such as a silicon nitride spacer or a spacer layer comprising multiple dielectric materials such as silicon dioxide, silicon nitride, silicon oxynitride, silicon carbide, or a combination thereof, but not limited thereto. According to one embodiment, a contact etch stop layer (CESL) 112 and an inter-layer dielectric (ILD) layer 114 may be formed on the substrate 100 around the dielectric layer 110. A lightly doped drain (LDD) region 102 and a source/drain (S/D) region 104 may be formed in the substrate 100.

An opening 111 is formed in the dielectric layer 110. The opening 111 is a gate trench, which includes a bottom surface and a sidewall surface. The sidewall surface of the opening 111 may be the interior sidewall surface of the dielectric layer 110. The bottom surface of the opening 11 may be the main surface 100a of the substrate. In some cases, an interfacial layer (not explicitly shown in this figure), such as a thin silicon oxide layer, may be formed on the bottom surface of the opening 111.

A high-k dielectric layer 210 is conformally disposed along the sidewall surface and the bottom surface of the opening 111. The high-k dielectric layer 210 may be composed of a material selected from the group including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST), etc.

A metal layer 212 is conformally disposed on the high-k dielectric layer 210 within the opening 111 along the sidewall surface and the bottom surface of the opening 111. According to one embodiment, the metal layer 212 may comprise a work function metal layer. According to one embodiment, the metal layer 212 may further comprise a bottom barrier layer (not explicitly shown) between the high-k dielectric layer 210 and the work function metal layer.

The bottom barrier layer may comprise a single or composite layer comprising tantalum nitride (TaN) or titanium nitride (TiN), etc. The work function metal layer may comprise a single or a composite layer with desired work function which meets the transistor's requirement. For example, the work function metal layer may be composed of a material selected from the group including titanium nitride (TiN), titanium carbide (TiC), tantalum nitride (TaN), tantalum carbide (TaC), tungsten carbide (WC), titanium aluminide (TiAl), aluminum titanium nitride (TiAlN), etc.

According to one embodiment, the semiconductor structure 1 further includes a top barrier layer (or diffusion barrier layer) 214 that is conformally disposed on the metal layer 212 along the sidewall surface and the bottom surface of the opening 111. According to one embodiment, the top barrier layer 214 may comprise a single or composite layer comprising tantalum nitride (TaN) or titanium nitride (TiN), etc.

According to one embodiment, the semiconductor structure 1 further includes a nucleation metal layer 216 that is conformally disposed on the top barrier layer 214 along the sidewall surface and the bottom surface of the opening 111. According to one embodiment, the nucleation metal layer 216 comprises tungsten.

According to one embodiment, the semiconductor structure 1 further includes a film-growth retarding layer 218 that is disposed only on an upper surface of the nucleation metal layer 216 within the opening 111. The film-growth retarding layer 218 comprises tungsten nitride (WN).

According to one embodiment, the semiconductor structure 1 further includes a bulk metal layer 220 disposed on the nucleation metal layer 218 and on the film-growth retarding layer 218. According to one embodiment, the film-growth retarding layer 218 is disposed between an upper portion of the nucleation metal layer 218 and an upper portion of the bulk metal layer 220. According to one embodiment, the bulk metal layer 220 comprises tungsten.

The metal layer 212, the top barrier layer 214, the nucleation metal layer 216, the film-growth retarding layer 218, and the bulk metal layer 220 constitute a replacement gate structure 200. According to one embodiment, the replacement gate structure 200 has a flat top surface that is substantially flush with a top surface of the dielectric layer 110 and the ILD layer 114. It is understood that in some embodiments, a portion of the ILD layer 114 and a portion of the CESL 112 may be removed to form a contact hole that exposes the underlying S/D region 104. Subsequently, a contact plug (not shown) may be formed within the contact hole.

Figure 2:
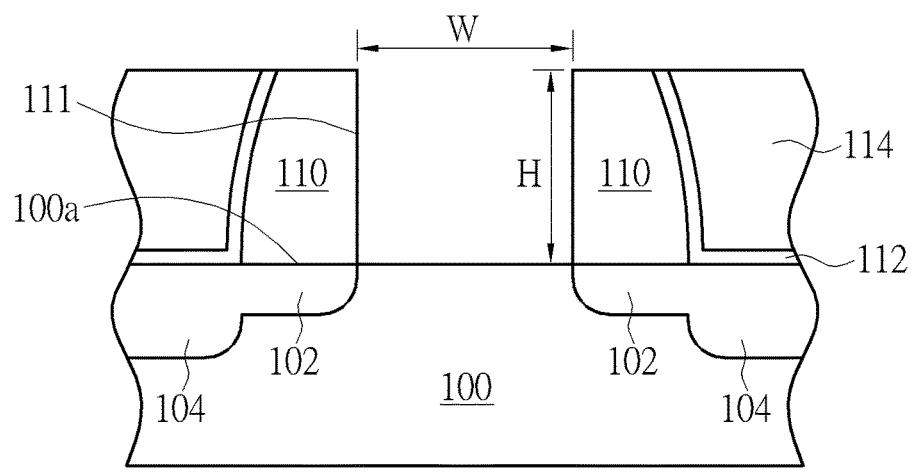
FIG. 2 to FIG. 8 are schematic, cross-sectional diagram showing an exemplary method for fabricating the semiconductor structure without tungsten seam as set forth in FIG. 1 in accordance with one embodiment of the invention.

FIG. 2 to FIG. 8 are schematic, cross-sectional diagram showing an exemplary method for fabricating the semiconductor structure 1 without tungsten seam as set forth in FIG. 1 in accordance with one embodiment of the invention, wherein like numeral numbers designate like regions, layers, or elements. As shown in FIG. 2, first, a substrate 100 is provided. For example, the substrate 100 may be a silicon substrate or any other suitable semiconductor substrates such as SiGe substrate or an SOI substrate, but not limited thereto. According to one embodiment, for example, the substrate 100 may be a P-type doped silicon substrate. The substrate 100 may comprise at least a fin structure, but not limited thereto.

A dielectric layer 110 is formed on a main surface 100a of the substrate 100. According to one embodiment, the dielectric layer 110 may be a spacer layer such as a silicon nitride spacer, but not limited thereto. According to one embodiment, a contact etch stop layer (CESL) 112 and an inter-layer dielectric (ILD) layer 114 may be formed on the substrate 100 around the dielectric layer 110. An LDD region 102 and a S/D region 104 may be formed in the substrate 100.

An opening 111 is then formed in the dielectric layer 110 by removing a dummy poly gate (not shown). The opening 111 is a gate trench, which includes a bottom surface and a sidewall surface. The sidewall surface of the opening 111 may be the interior sidewall surface of the dielectric layer 110. The bottom surface of the opening 11 may be the main surface 100a of the substrate. In some cases, an interfacial layer (not explicitly shown in this figure), such as a thin silicon oxide layer, may be formed on the bottom surface of the opening 111.

The opening 111 has a width W and a height H. According to one embodiment, the width W may range between 20 and 130 angstroms. For example, for a PMOS transistor, the width W of the opening 111 is about 40 angstroms, while for an NMOS transistor, the width W of the opening 111 is about 100~130 angstroms. According to one embodiment, the height H of the opening 111 may range between 1200 angstroms and 1800 angstroms, for example, 1500 angstroms.

Figure 3:
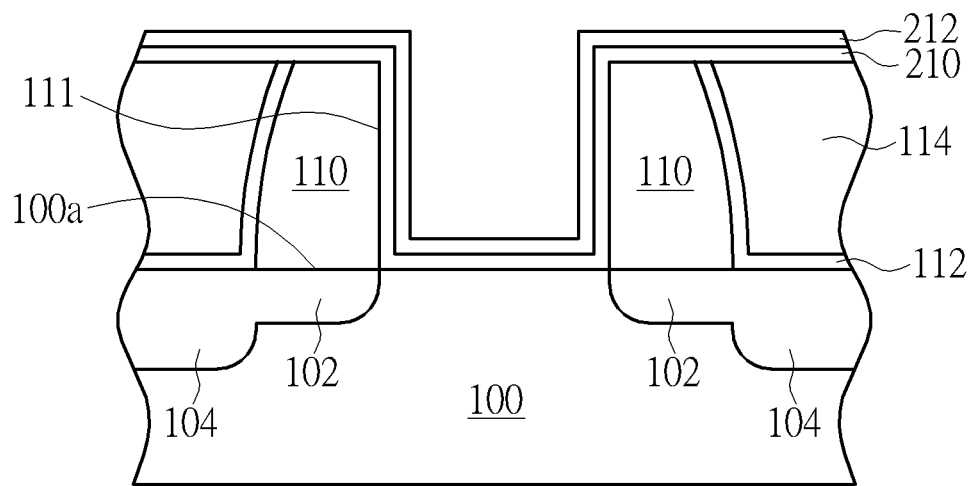

As shown in FIG. 3, a high-k dielectric layer 210 is conformally deposited along the sidewall surface and the bottom surface of the opening 111. The high-k dielectric layer 210 may be composed of a material selected from the group including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST), etc.

After depositing the high-k dielectric layer 210, a metal layer 212 is conformally disposed on the high-k dielectric layer 210 within the opening 111 along the sidewall surface and the bottom surface of the opening 111. According to one embodiment, the metal layer 212 may comprise a work function metal layer. According to one embodiment, the metal layer 212 may further comprise a bottom barrier layer (not explicitly shown) between the high-k dielectric layer 210 and the work function metal layer.

The bottom barrier layer may comprise a single or composite layer comprising tantalum nitride (TaN) or titanium nitride (TiN), etc. The work function metal layer may comprise a single or a composite layer with desired work function which meets the transistor's requirement. For example, the work function metal layer may be composed of a material selected from the group including titanium nitride (TiN), titanium carbide (TiC), tantalum nitride (TaN), tantalum carbide (TaC), tungsten carbide (WC), titanium aluminide (TiAl), aluminum titanium nitride (TiAlN), etc.

The high-k dielectric layer 210 and the metal layer 212 are also deposited on the dielectric layer 110 and the inter-layer dielectric (ILD) layer 114 outside the opening 111.

Figure 4:
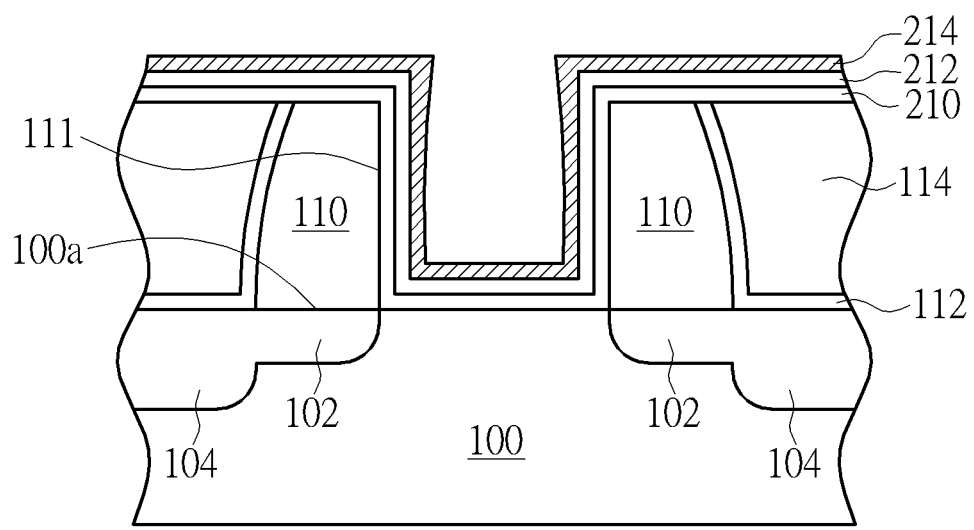

As shown in FIG. 4, a top barrier layer (or diffusion barrier layer) 214 is conformally deposited on the metal layer 212 along the sidewall surface and the bottom surface of the opening 111. According to one embodiment, the top barrier layer 214 may comprise a single or composite layer comprising tantalum nitride (TaN) or titanium nitride (TiN), etc.

Figure 5:
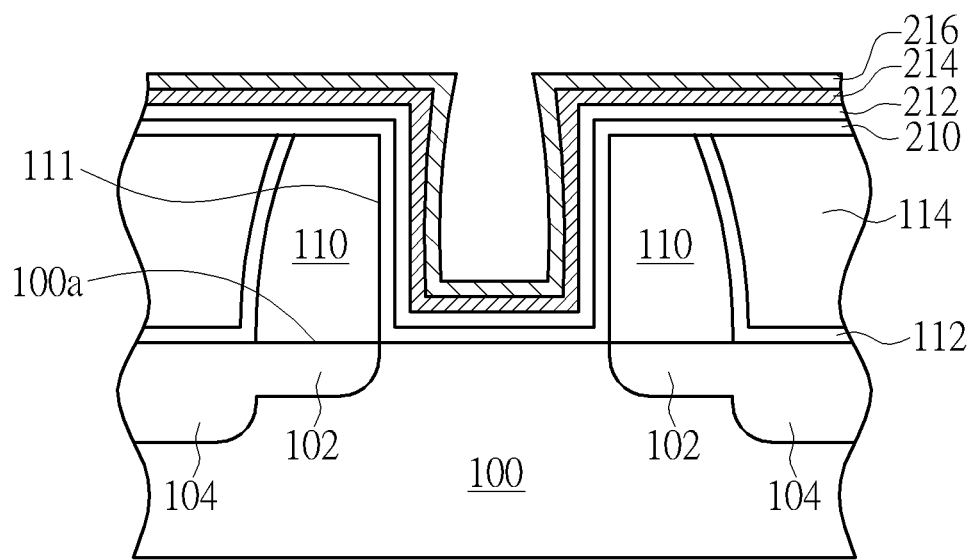

As shown in FIG. 5, a nucleation metal layer 216 that is conformally disposed on the top barrier layer 214 along the sidewall surface and the bottom surface of the opening 111. According to one embodiment, the nucleation metal layer 216 comprises tungsten. According to one embodiment, the nucleation metal layer 216 may be deposited by atomic layer deposition (ALD) methods, but not limited thereto. For example, the substrate 100 or wafer may be exposed to tungsten hexafluoride ($WF_6$) and reducing gas such as silane ($SiH_4$) or diborane ($B_2H_6$) to deposit a tungsten nucleation layer on the top barrier layer 214. Such tungsten nucleation layer deposition process may be carried out in a CVD tool such as Altus Max system, but not limited thereto.

Figure 6:
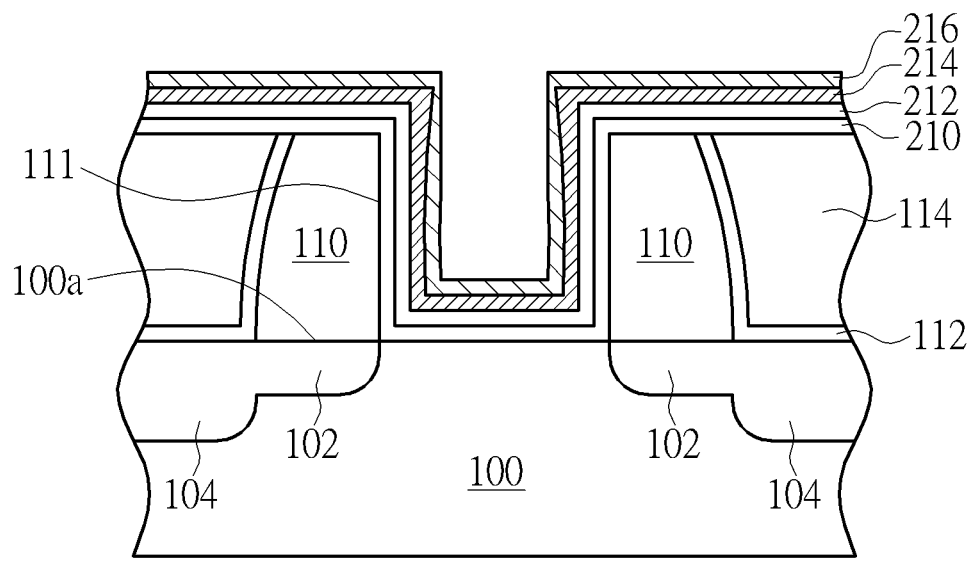

As shown in FIG. 6, optionally, a trimming process is performed to partially etch an upper portion of the nucleation metal layer 216. According to one embodiment, the trimming process comprises a step of etching the upper portion of the nucleation metal layer 216 using an activated fluorine species such as fluorine radicals, but not limited thereto. By partially etching away only an upper portion of the nucleation metal layer 216, a more vertical sidewall is present in the opening 111 at this stage and a remaining space at the upper end of the opening 111 may be widened.

According to one embodiment, the activated fluorine species may be provided by a remote plasma source using a fluorine source gas comprising $NF_3$ under a power ranging between 800 W and 1800 W and a $NF_3$ flowrate ranging between 5 sccm and 20 sccm. The nucleation metal layer 216 may be exposed to the activated fluorine species for a time period of about 1~50 seconds.

Figure 7:
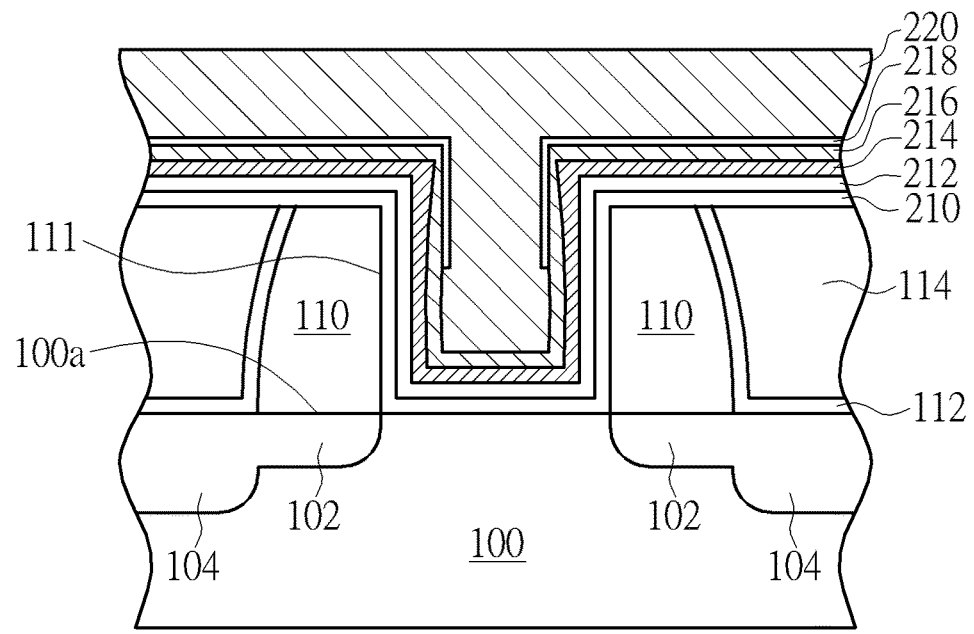

As shown in FIG. 7, subsequently, a film-growth retarding layer 218 is formed only on an upper surface of the nucleation metal layer 216. The film-growth retarding layer 218 comprises tungsten nitride (WN). To partially form the film-growth retarding layer 218 only on the upper surface of the nucleation metal layer 216, the nucleation metal layer 216 may be exposed to activated nitrogen species such as nitrogen radicals. The tungsten atoms react with the nitrogen radicals to form the tungsten nitride. According to one embodiment, the activated nitrogen species may be provided by a remote plasma source using a nitrogen source gas such as $N_2$ under a power of about 1800 W and a $N_2$ flowrate ranging between 1 sccm and 5 sccm. The nucleation metal layer 216 may be exposed to the activated nitrogen species for a time period of about 5~10 seconds.

Subsequently, a bulk metal layer 220 is deposited on the nucleation metal layer 218 and on the film-growth retarding layer 218. According to one embodiment, the film-growth retarding layer 218 is disposed between an upper portion of the nucleation metal layer 218 and an upper portion of the bulk metal layer 220. According to one embodiment, the bulk metal layer 220 comprises tungsten.

Due to the presence of the film-growth retarding layer 218 on the upper surface of the nucleation metal layer 216, the tungsten deposition is basically a bottom-up deposition/growth process. The tungsten deposition/growth rate on the surface of the nucleation metal layer 216 at the bottom surface of the opening 111 is higher than the tungsten deposition/growth rate at the upper surface of the opening 111 with the film-growth retarding layer 218. Therefore, no seam or void is observed in the opening 111 after the bulk metal layer 220 is deposited.

According to one embodiment, the bulk metal layer 220 may be deposited by chemical layer deposition (CLD) methods, but not limited thereto. For example, the substrate 100 or wafer may be exposed to tungsten hexafluoride ($WF_6$) and reducing gas such as hydrogen ($H_2$) to deposit a bulk tungsten layer on the nucleation metal layer 216. Such bulk tungsten layer deposition process may be carried out in a CVD tool such as Altus Max system, but not limited thereto.

Figure 8:
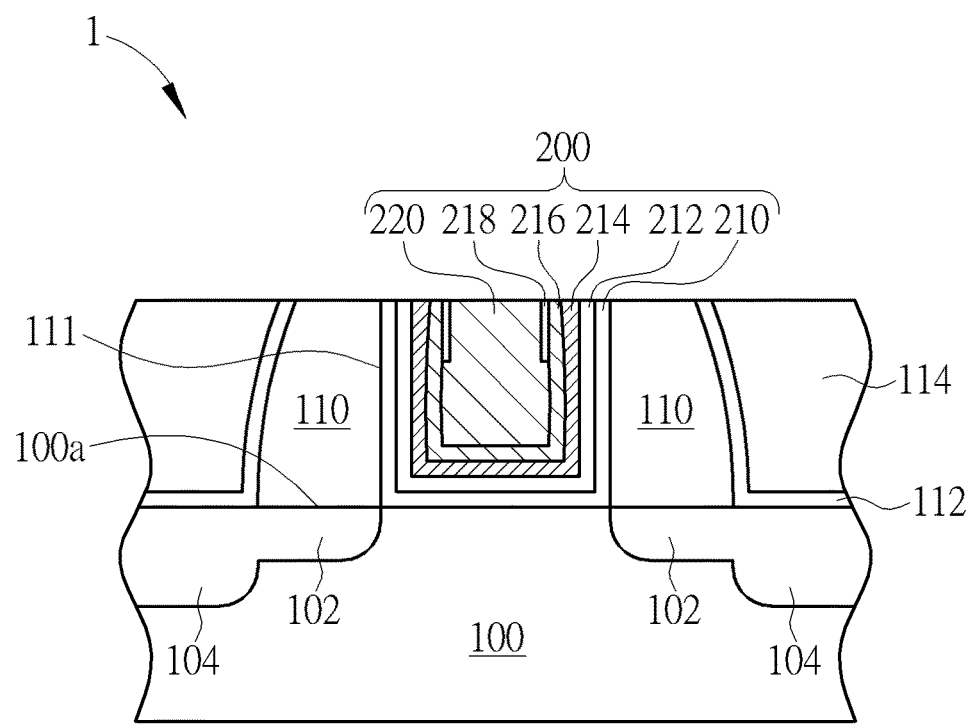

As shown in FIG. 8, a chemical mechanical polishing (CMP) process is then performed to polish the bulk metal layer 220, the film-growth retarding layer 218, the nucleation metal layer 216, the top barrier layer 214, the metal layer 212, and the high-k dielectric layer 210 outside the opening 111 to thereby form a flat top surface. Subsequently, the ILD layer 114 and a portion of the CESL 112 may be removed to form a contact hole (not shown) that exposes the underlying S/D region 104. Subsequently, a contact plug (not shown) may be formed within the contact hole.

Since the presence of the film-growth retarding layer 218 overlying the dielectric layer 110 and the ILD layer 114, the thickness of the bulk tungsten layer 220 deposited outside the opening 111 may be reduced. Therefore, the processing time for the CMP process can also be reduced. This is beneficial because the throughput of the wafer fabrication can be increased.

Figure 9:
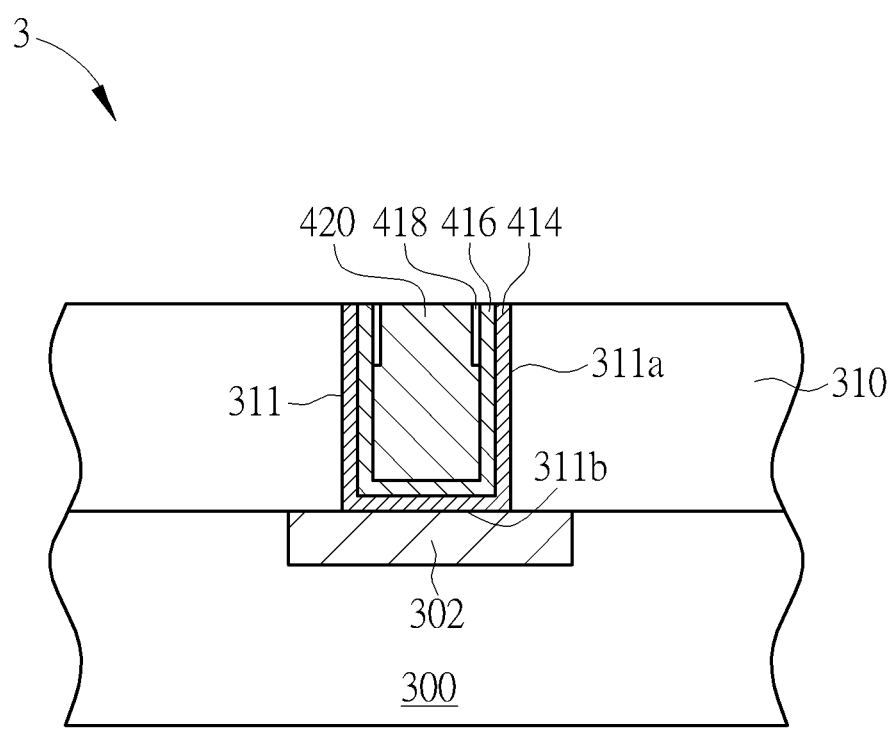
FIG. 9 is a schematic, cross-sectional diagram showing an exemplary semiconductor structure without tungsten seam in accordance with another embodiment of the invention.

FIG. 9 is a schematic, cross-sectional diagram showing an exemplary semiconductor structure 3 without tungsten seam in accordance with another embodiment of the invention. As shown in FIG. 9, the semiconductor structure 3 includes a substrate 300 having thereon a dielectric layer 310. An opening 311 such as a contact hole or via hole is formed in the dielectric layer 310. The opening 311 comprises a bottom surface 311a and a sidewall surface 311b. A diffusion barrier layer 414 is conformally disposed along the sidewall surface 311a and the bottom surface 311b of the opening 311. A nucleation metal layer 416 is conformally disposed on the diffusion barrier layer 414. A bulk metal layer 418 is deposited on the nucleation metal layer 420 and fills up the opening 111. A film-growth retarding layer 418 is disposed between an upper portion of the nucleation metal layer 416 and an upper portion of the bulk metal layer 420.

According to another embodiment, the opening 111 is a contact hole opening. The dielectric layer 310 may be an inter-layer dielectric (ILD) layer such as silicon oxide, but not limited thereto. A conductive region 302 may be disposed in the substrate 300 and the diffusion barrier layer 414 is in direct contact with the conductive region 302.

According to another embodiment, the diffusion barrier layer comprises titanium nitride. According to another embodiment, the nucleation metal layer comprises tungsten. According to another embodiment, the bulk metal layer comprises tungsten. According to another embodiment, the film-growth retarding layer comprises tungsten nitride. According to another embodiment, the film-growth retarding layer is disposed only on an upper surface of the nucleation metal layer within the opening.

Various processes may be used to form the nucleation metal layer 416, including but not limited to, chemical vapor deposition (CVD) processes, atomic layer deposition (ALD) processes, and pulsed nucleation layer (PNL) deposition processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate having thereon a dielectric layer;
    an opening in the dielectric layer, wherein the opening comprises a bottom surface and a sidewall surface;
    a diffusion barrier layer conformally disposed along the sidewall surface and the bottom surface of the opening;
    a nucleation metal layer conformally disposed on the diffusion barrier layer;
    a bulk metal layer directly on the nucleation metal layer and filling up the opening; and
    a film-growth retarding layer covering only an upper portion of the nucleation metal layer and sandwiched between the nucleation metal layer and the bulk metal layer within the opening.

2. The semiconductor structure of claim 1, wherein the opening is a gate trench opening and the substrate is a semiconductor substrate.

3. The semiconductor structure of claim 2, wherein the dielectric layer comprises a spacer layer.

4. The semiconductor structure of claim 3, wherein the spacer layer comprises silicon nitride.

5. The semiconductor structure of claim 2 further comprising a high-k dielectric layer and a work function metal layer between the substrate and the diffusion barrier layer.

6. The semiconductor structure of claim 1, wherein the opening is a contact hole opening.

7. The semiconductor structure of claim 6, wherein the dielectric layer is an inter-layer dielectric (ILD) layer.

8. The semiconductor structure of claim 6 further comprising a conductive region in the substrate and the diffusion barrier layer is in direct contact with the conductive region.

9. The semiconductor structure of claim 1, wherein the diffusion barrier layer comprises titanium nitride.

10. The semiconductor structure of claim 1, wherein the nucleation metal layer comprises tungsten.

11. The semiconductor structure of claim 10, wherein the bulk metal layer comprises tungsten.

12. The semiconductor structure of claim 11, wherein the film-growth retarding layer comprises tungsten nitride.

13. The semiconductor structure of claim 1, wherein the bulk metal layer fills up the opening.

14. A method for fabricating a semiconductor structure, comprising:
    providing a substrate having thereon a dielectric layer;
    forming an opening in the dielectric layer, wherein the opening comprises a bottom surface and a sidewall surface;
    conformally depositing a diffusion barrier layer along the sidewall surface and the bottom surface of the opening;
    conformally depositing a nucleation metal layer on the diffusion barrier layer;
    forming a film-growth retarding layer covering only an upper portion of the nucleation metal layer within the opening; and
    depositing a bulk metal layer directly on the nucleation metal layer and the film-growth retarding layer in different deposition rate until filling up the opening.

15. The method for fabricating a semiconductor structure of claim 14, wherein before forming the film-growth retarding layer on the upper surface of the nucleation metal layer, the method further comprises:
    trimming an upper portion of the nucleation metal layer.

16. The method for fabricating a semiconductor structure of claim 15, wherein trimming the upper portion of the nucleation metal layer comprises:
   etching the upper portion of the nucleation metal layer using an activated fluorine species.

17. The method for fabricating a semiconductor structure of claim 16, wherein the activated fluorine species is provided by a remote plasma source.

18. The method for fabricating a semiconductor structure of claim 14, wherein the opening is a gate trench opening and the substrate is a semiconductor substrate.

19. The method for fabricating a semiconductor structure of claim 18, wherein the dielectric layer comprises a spacer layer.

20. The method for fabricating a semiconductor structure of claim 19, wherein the spacer layer comprises silicon nitride.

21. The method for fabricating a semiconductor structure of claim 18 further comprising:
   forming a high-k dielectric layer and a work function metal layer between the substrate and the diffusion barrier layer.

22. The method for fabricating a semiconductor structure of claim 14, wherein the opening is a contact hole opening.

23. The method for fabricating a semiconductor structure of claim 22, wherein the dielectric layer is an inter-layer dielectric (ILD) layer.

24. The method for fabricating a semiconductor structure of claim 22 further comprising a conductive region in the substrate and the diffusion barrier layer is in direct contact with the conductive region.

25. The method for fabricating a semiconductor structure of claim 14, wherein the diffusion barrier layer comprises titanium nitride.

26. The method for fabricating a semiconductor structure of claim 14, wherein the nucleation metal layer comprises tungsten.

27. The method for fabricating a semiconductor structure of claim 26, wherein the bulk metal layer comprises tungsten.

28. The method for fabricating a semiconductor structure of claim 27, wherein the film-growth retarding layer comprises tungsten nitride.

* * * * *